United States Patent [19]

Kataoka et al.

[11] 3,836,989

[45] Sept. 17, 1974

[54] BULK SEMICONDUCTOR DEVICE

[75] Inventors: Shoei Kataoka; Nobuo Hashizume, both of Tokyo; Kazutaka Tomizawa, Kamagaya; Mititada Morisue, Urawa; Yasuo Komamiya, Yokohama, all of Japan

[73] Assignee: Agency of Industrial Science & Technology, Tokyo, Japan

[22] Filed: Feb. 15, 1973

[21] Appl. No.: 332,730

[52] U.S. Cl. ................. 357/3, 307/216, 307/252 E, 307/299, 331/107 G, 357/15, 357/68

[51] Int. Cl. ............................................ H03k 17/72

[58] Field of Search .................... 317/234 V, 234 N; 331/107 G

[56] References Cited

UNITED STATES PATENTS

| | | | |
|---|---|---|---|
| 3,365,583 | 1/1968 | Gunn | 317/234 V |
| 3,452,222 | 6/1969 | Shoji | 317/234 V |
| 3,538,400 | 11/1970 | Yanai et al. | 331/107 G |
| 3,585,609 | 6/1971 | Robrock | 331/107 G |
| 3,594,618 | 7/1971 | Hartnagel | 331/107 G |
| 3,597,625 | 8/1971 | Yanai et al. | 331/107 G |
| 3,602,731 | 8/1971 | Yanai et al. | 331/107 G |
| 3,602,734 | 8/1971 | Matsukura et al. | 331/107 G |
| 3,651,348 | 3/1972 | Matsukura et al. | 331/107 G |
| 3,659,158 | 4/1972 | Shoji | 331/107 G |
| 3,691,481 | 9/1972 | Kataoka et al. | 331/107 G |

*Primary Examiner*—Rudolph V. Rolinec
*Assistant Examiner*—William D. Larkins
*Attorney, Agent, or Firm*—Kurt Kelman

[57] ABSTRACT

Disclosed is a semiconductor device comprising at least two semiconductor elements integrally connected by an insulator, each semiconductor showing negative differential conductivity under the influence of a high electric field. A high electric field domain or space charges which are generated in one of the semiconductor elements can be transferred to the other element by directly affecting the other element via an insulator.

28 Claims, 27 Drawing Figures

FIG. 8
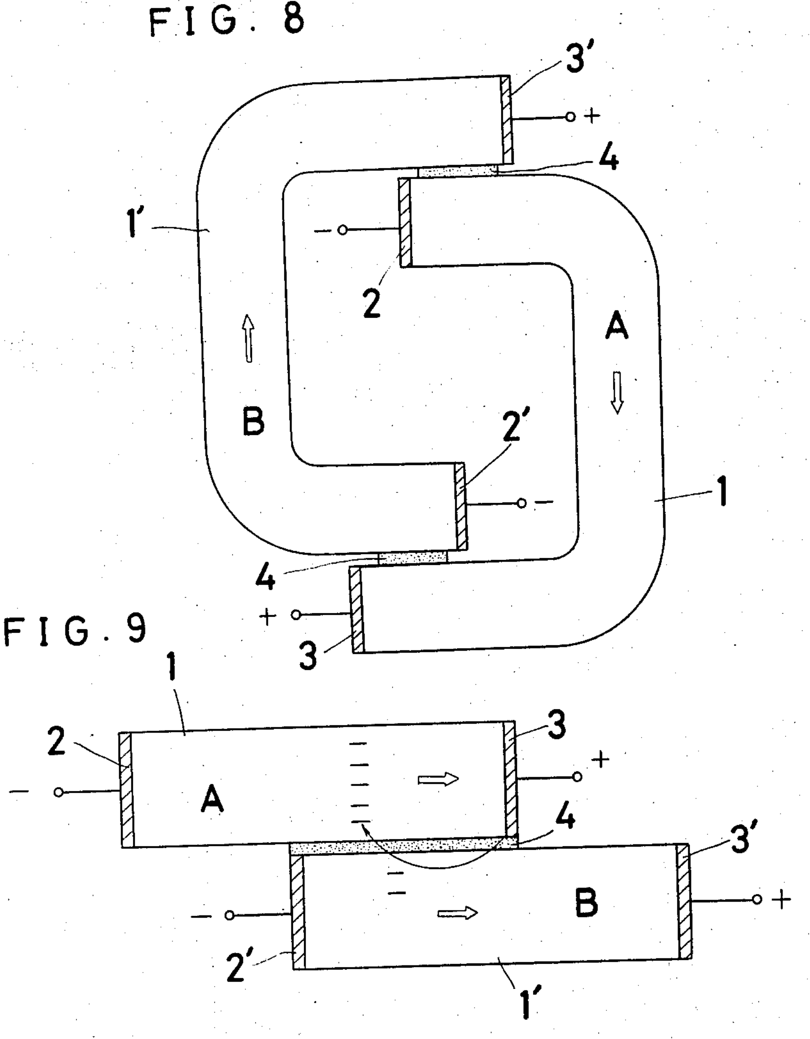
FIG. 8, FIG. 9
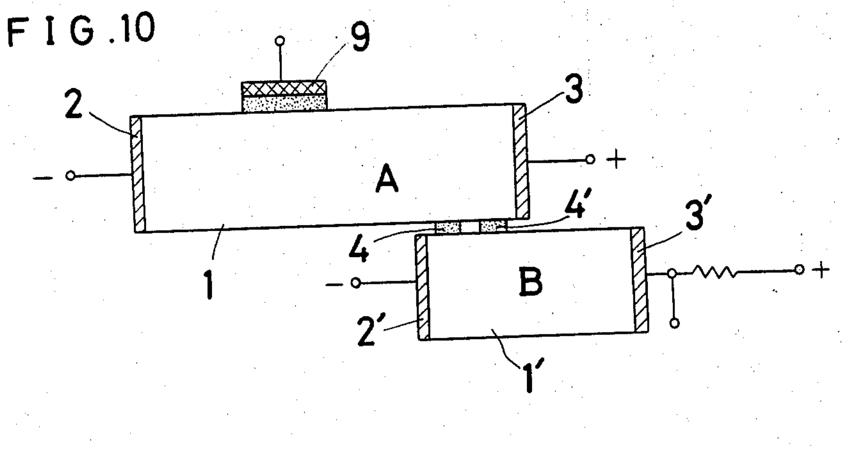
FIG. 10

BULK SEMICONDUCTOR DEVICE

BACKGROUND OF THE INVENTION

This invention relates to a bulk semiconductor device. More specifically, this invention relates to a bulk semiconductor device comprising at least two semiconductor elements integrally connected by an insulator. The semiconductor used in this invention is one which shows differential negative conductivity when subjected to an electric field above certain strength, such as GaAs, InP, $Ga_xIn_{1-x}Sb$ and other semiconductor compounds. If a high electric field domain or an electric field due to space charges appears in one of the semiconductor elements, it will affect the other semiconductor element via the intervenient insulator in such a way that space charges are induced in the other element, thus causing the high electric field domain to be transferred from one to the other element. As mentioned above, certain semiconductor compounds when subjected to certain strength of electric field, will show differential negative conductivity of the electric field control type. As is well known, if an electric field above a certain threshold strength is applied to such a semiconductor element, space charges will appear in the semiconductor element, thus generating a high electric field domain therein. The threshold strength of the electric field is about 3KV/cm for GaAs, about 10KV/cm for InP and about 500V/cm for $Ga_xIn_{1-x}Sb$. As seen from these figures, if a semiconductor element has a substantial length, the voltage which must be applied thereto to generate a high electric field domain must be of a large value.

Hitherto, in information processing by means of a high electric field domain, the change in the electric currents flowing in a semiconductor element has been detected in terms of output voltage across a resistor which is connected to the element in the form of a load resistance, and then the output voltage has been applied to the input of a subsequent semiconductor element, by electric wire connection etc. As a result of this mode of connection a considerable length of time (at least several hundreds pico seconds) has been required in transferring a high electrc field domain from one semiconductor to another. Also disadvantageously the wiring connection between adjacent elements has made the structure of the whole device complex and bulky. Also, in such a structure, stray coupling is likely to occur and cause erroneous operation of the device.

One object of this invention is to provide a semiconductor device which allows a high electric field domain to transfer from one semiconductor element to other semiconductor element at an extremely high speed (10–20 pico seconds).

Another object of this invention is to provide a semiconductor device which is simple in structure, reliable in electric field domain transferring operation and operable at relatively low voltage.

Still another object of this invention is to provide a semiconductor device which can be applied to high speed logic operation, digital information processing, and high power and high gain microwave amplification.

SUMMARY OF THE INVENTION

To attain the objects above mentioned the bulk semiconductor device according to this invention comprises at least two semiconductor elements integrally connected by an insulator, each element composed of a semiconductor material which will show differential negative conductivity when subjected to a relatively high electric field. A high electric field domain which is generated by suitable means in one of the elements is allowed to "leak" into the other element via the intervenient insulator, and the electric field which is composed of the electric lines of force thus "leaked out" will locally affect and change the electric field in the other element, thus causing a high electric field domain to appear in the other element. In the bulk semiconductor device according to this invention a high electric field domain can directly be transferred from one elemnt to another, thus reducing the transfer time to the minimum.

The above and other objects and advantages of this invention will be apparent from the following description when considered in connection with the accompanying drawings.

BRIEF DESCRIPTION OF THE DRAWINGS

FIG. 8 is another embodiment in which a high electric field domain generated in the loop structure is allowed to circulate, thus functioning as a memory device.

FIG. 9 shows another embodiment in which a space charges layer can be transferred from one element to another.

FIG. 10 shows a high electric field domain detector according to this invention.

Referring to FIGS. 1(A) to 1(C), a bulk semiconductor device according to this invention is shown as comprising two semiconductor elements "A" and "B" longitudinally staggered and connected to each other via an insulator 4. The element "A" is composed of a length of semiconductor 1 whose opposite ends have ohmic contact electrodes 2 and 3. Likewise, the element "B" is composed of a length of semiconductor 1' whose opposite ends have ohmic contact electrodes 2' and 3'. As mentioned earlier the semiconductor used is one which will show differential negative conductivity when subjected to a relatively high electric field.

A high electric field domain composed of an electric dipole layer of space charges as shown in FIG. 1(A) will be made to appear in one of these elements, for instance in the element "A," by applying thereto a bias electric field of a sufficient strength to maintain a high electric field domain when generated, and by raising the bias voltage across the ohmic contact electrodes 2 and 3 of the element "A" beyond a certain critical value for a short time. Otherwise, such a high electric field domain can be generated by applying a triggering signal to an additional electrode (ohmic or capacitative or Schottky electrode), or by exposing the element to the light from an associated luminescent diode. While the high electric field domain is travelling to the anode 3 of the element "A," another high electric field domain tends to appear in the other element "B" via an insulator 4 because the electric lines of force originating from the space charges in the element "A" pass through the insulator 4 into the semiconductor 1' of element "B." (FIG. 1(B)) The local electric field in the element "B" will generate space charges therein. The high electric field domain thus generated will travel to the anode of the element "B." (FIG. 1(C)) Thus, the high electric field domain is transferred from element "A" to element "B." In other words, the high electric field domain can travel a distance longer than the full length of a single element.

In these embodiments, the insulator preferably has a low dielectric constant, and is very thin. Also, preferably the insulator is about as wide as or wider than the width of the high electric field domain. Various materials including SiO can be used for the insulator.

Figure 1A:
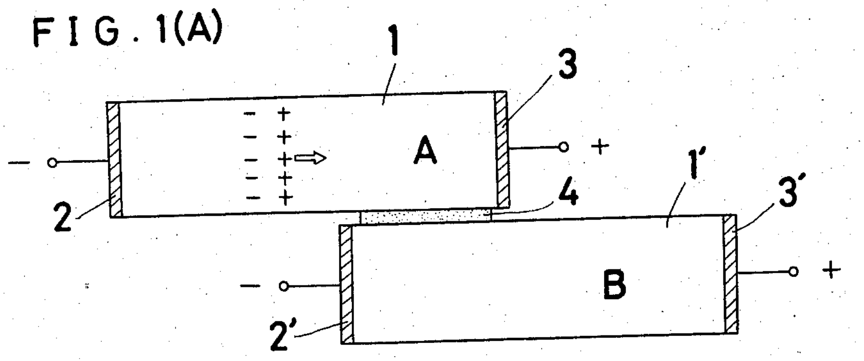
FIGS. 1(A) to 1(C) diagrammatically show a basic embodiment of this invention and its principle according to which a high electric field domain is transferred from one semiconductor element to another.
Figure 1B:
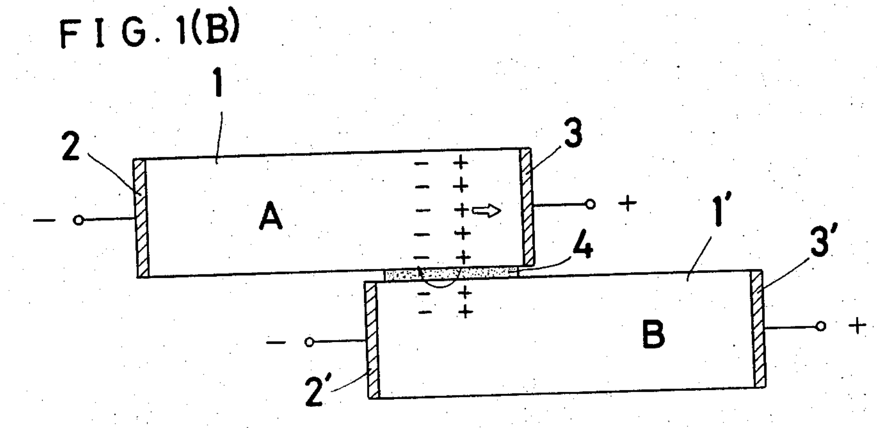
Figure 1C:
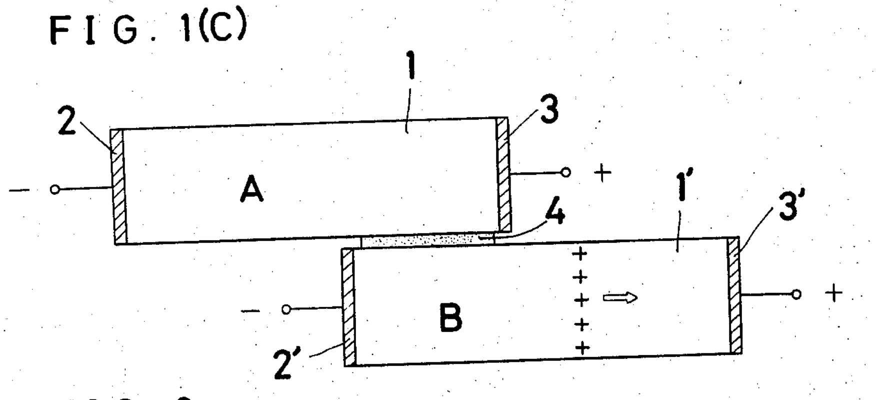
Figure 2:
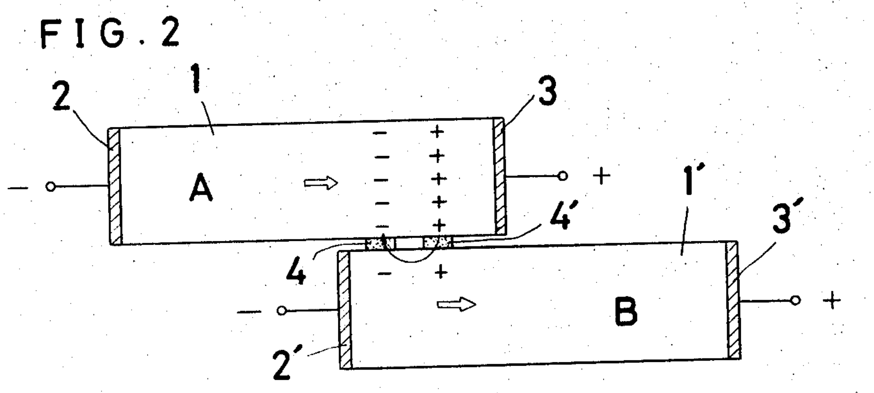
FIG. 2 diagrammatically shows another embodiment of this invention.

Referring to FIG. 2, another embodiment of this invention is shown as comprising two elements "A" and "B" longitudinally staggered and connected to each other by a pair of insulators 4 and 4'. These insulators are positioned at an interval which is about equal to the width of a high electric field domain. When a high electric field domain generated reaches the insulators 4 and 4', the electric lines of force originating from the space charges of the high electric field domain will extend into the other element "B" via these insulators 4 and 4' with the result that a high electric field domain due to the local leakage of the electric lines of force appears in the element "B." The high electric field domain in the element "B" thus generated will travel to the anode 3' of the element "B." Thus, the high electric field domain is transferred from element "A" to element "B."

Figure 3A:
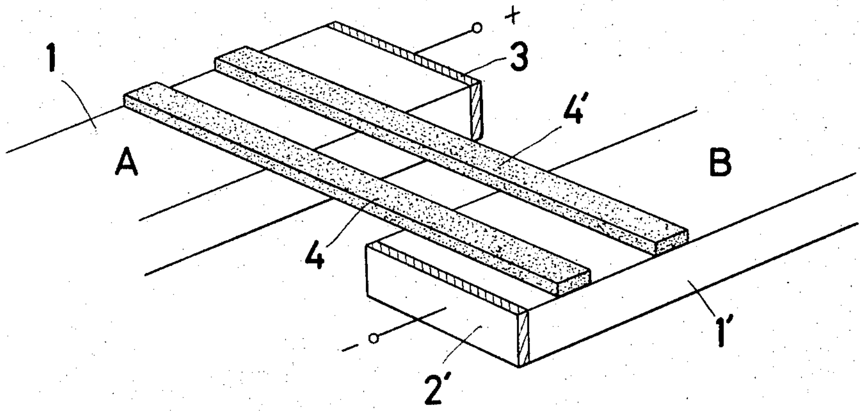
FIGS. 3 and 4 show planar type devices according to this invention.

Referring to FIG. 3(A), a planar type device is shown as comprising two planar bulk elements "A" and "B" longitudinally overlapped a certain distance and connected to each other by a pair of insulators 4 and 4'.

Preferably in the device of this type the insulator used is, for instance, $BaTiO_3$ or other high dielectric constant materials.

Figure 3B:
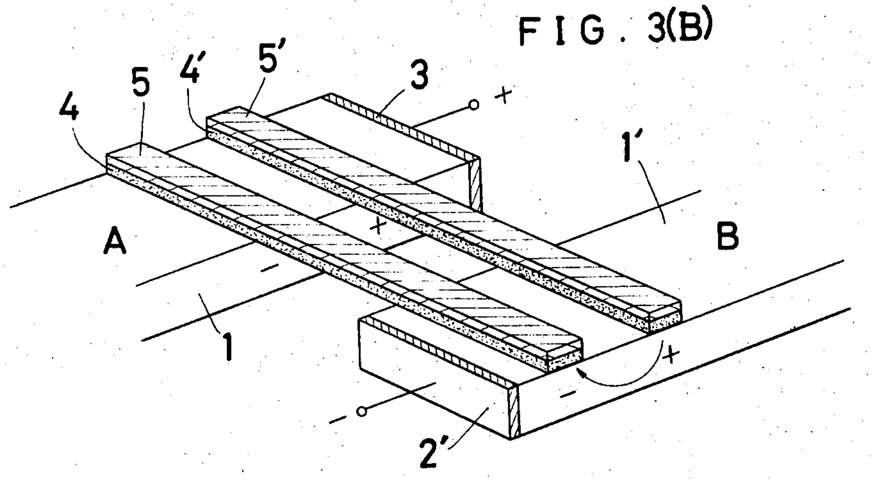
Figure 4:
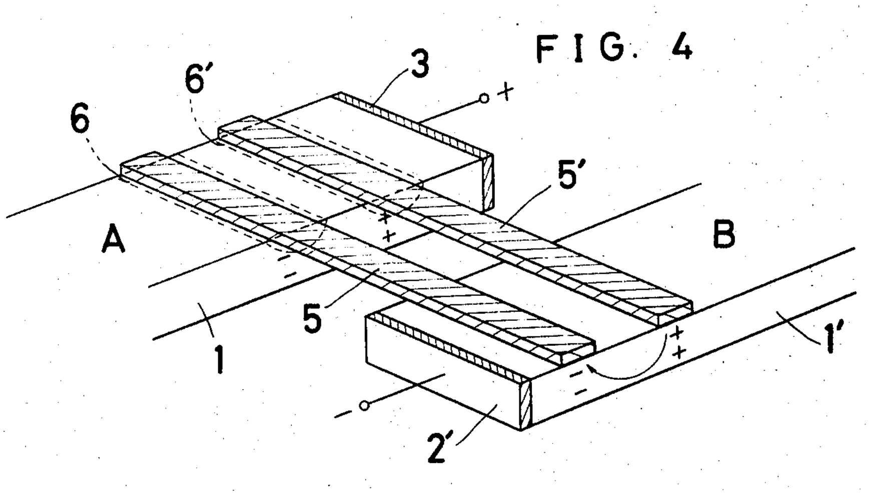

Referring to FIG. 3(B), an embodiment of an improved planar type device is shown as being similar to that of FIG. 3(A) except for metal strips 5 and 5' applied onto the insulators 4 and 4'. In this arrangement of high electric field domain will be efficiently transferred from element "A" to element "B" via the insulators and metal strips because of the equi-potential nature of the metal conductor, thus increasing the local electric field which generates a high electric field domain in the element "B." In place of the insulators and metal strips, Schottky type contact metal strips 5 and 5' may be applied directly to the semiconductors, as shown in FIG. 4. In the instance where metal strips 5 and 5' are attached to the element "A" and at the same time to the element "B," the metal strips will automatically be negatively biased with respect to the semiconductor 1 thereunder in the element "A" and depletion layers 6 and 6' will be produced beneath the metal strips 5 and 5' in the element "A."

The depletion layers 6 and 6' act as insulators in the same way as those described in FIG. 3(B). In this case, metal strips 5 and 5' on element "B" are automatically positively biased to formed ohmic contact.

Figure 5:
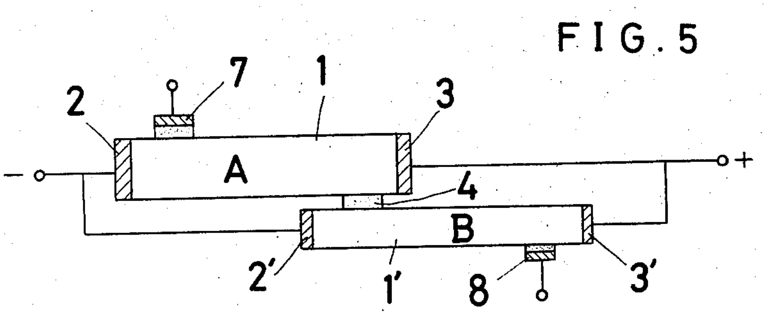
FIG. 5 shows a space charge amplifier according to this invention.

Referring to FIG. 5, a space charge amplifier according to this invention is schematically shown. A high-frequency input signal is applied to the input electrode 7 adjacent to the cathode 2 of the element "A," and an output signal is obtained from the output electrode 8 adjacent to the anode 3' of the element "B." The element "A" is responsive to the input signal to cause a space charge wave to appear in the semiconductor. The space charge wave is then amplified in the course of traveling because the semiconductor material shows differential negative conductivity. The amplified space charge wave is collected at the output electrode of the element "B." A high gain of amplification can be obtained because the space charge wave will travel a distance longer than the full length of a single element. As is readily understood from the above, the transfer of a high electric field domain or space charges from one to the other semiconductor element can be performed directly through the medium of an insulator, and therefore compared with the stepwise transfer which is conducted by applying the output from one element to the input of the next element by wire connection, the transfer time in the whole device according to this invention is negligibly small, and accordingly the operation speed is increased to the maximum. In the embodiments described above the whole device is composed of one-to-one semiconductor element connection, but it should be noted that one-to-two, one-to-"*n*", or two-to-one, "*n*"-to-one semiconductor element connection may be adopted as required.

Figures 6A, 6B:
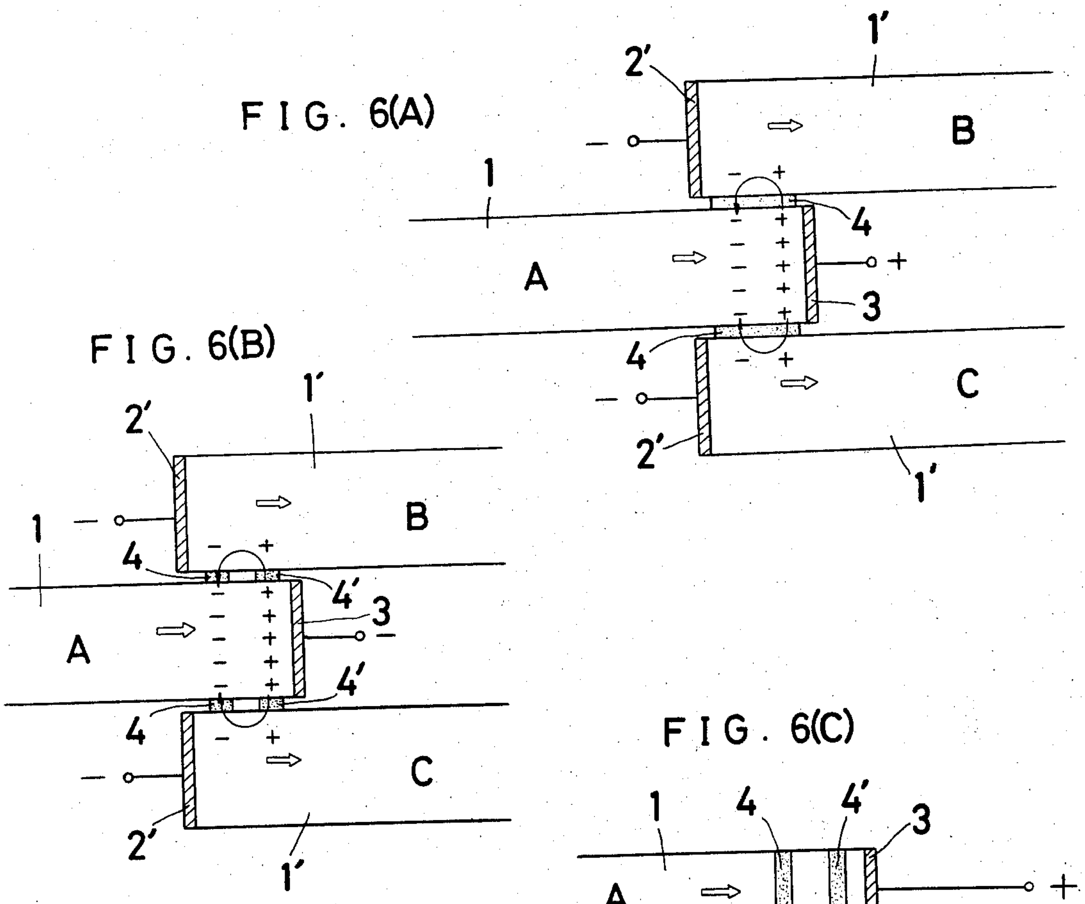
FIGS. 6(A) to 6(C) show embodiments in which a high electric field domain is transferred from one semiconductor element to two associated semiconductor elements, thus functioning as a "Distributor" devices.
Figure 6C:
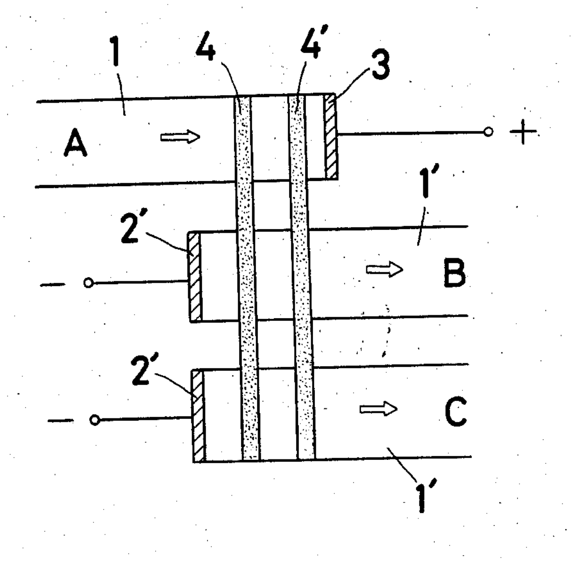

Referring to FIG. 6, there is shown an embodiment of this invention in which a high electric field domain is transferred from a semiconductor element "A" to two semiconductor elements "B" and "C" simultaneously. In FIG. 6(A), the device is shown as including one insulator on each of the transfer regions, whereas in FIG. 6(B) the device is shown as having two insulators on each of the transfer regions. In FIG. 6(C) there is shown an embodiment of planar structure connection. Each of these embodiments permits the direct and separate transfer of a high electric field domain, thus providing a device for amplifying and distributing a high electric field domain.

Figure 7A:
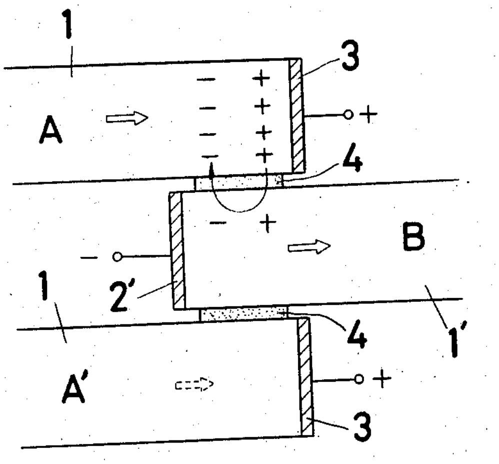
FIGS. 7(A) to 7(C) show other embodiments in which a high electric field domain from either of two semiconductor elements is transferred to the intervenient semiconductor element, thus functioning as an "OR" devices.
Figure 7B:
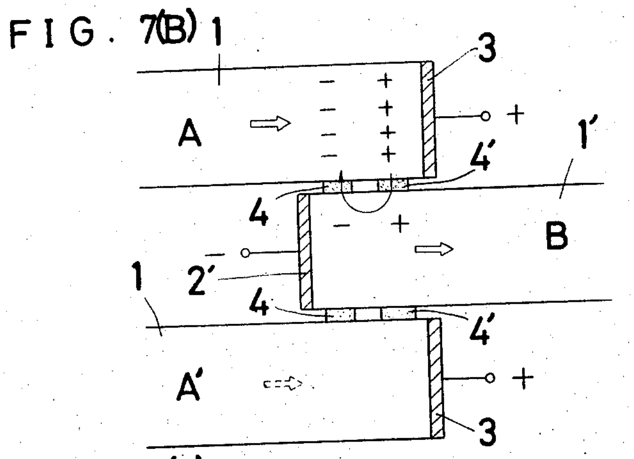
Figure 7C:
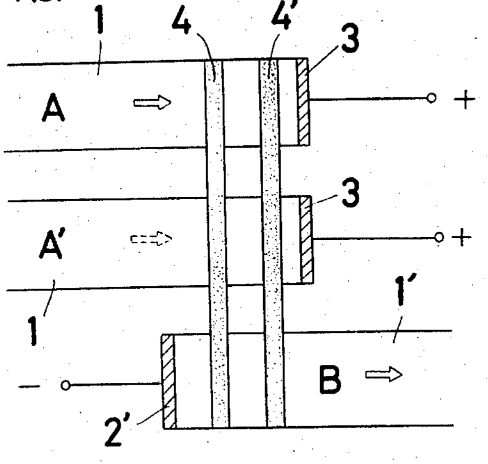

Referring to FIGS. 7(A) to 7(C), the devices shown are suitable for transferring a high electric field domain from either of two semiconductor elements "A" and "A′" to the intervenient semiconductor element "B." In FIG. 7(A) the device is shown as having one insulator on each of the transfer regions, and in FIG. 7(B) the device is shown as having two insulators on each of the transfer regions. In FIG. 7(C) there is shown an embodiment of the planar structure connection. In instances where a high electric field domain appears in one of the elements "A" and "A′," a high electric field domain will be caused to appear in the element "B." In other words the composite semiconductor device of FIG. 7 constitutes an "OR" device.

Referring to FIG. 8, a bulk semiconductor device is shown as comprising two "U"-shaped elements "A" and "B" partly overlapped and integrally connected in the form of a closed loop. More specifically, two elements are arranged in the opposite bias polarity relationship, and the ends of these elements are integrally connected with each other via insulators 4. Once a high electric field domain has been generated in the loop structure it will repeatedly travel around the loop without vanishing. Therefore, the loop structure may be used as a memory. The loop may, of course, be constituted of any number of semiconductor elements.

In the above, the explanation is made of the transfer of a high electric field domain which is composed of an electric dipole layer. However, it should be noted that space charges in the form of an electron accumulation layer can equally be transferred from one to the other element, as seen from FIG. 9. In the traveling wave type amplifier which uses the tendency of space charges to be amplified in a semiconductor with differential negative conductivity, the maximum semiconductor length is limited because the product of the concentration of impurity and the length of the semiconductor is required to be below a certain threshold (for example, below $10^{12}cm^{-2}$ in the case of GaAs) and the degree of amplification is consequently also limited.

In the semiconductor device according to this invention space charges can be transferred from one semiconductor element to another while being amplified in each element. Therefore, the actual length of the traveling distance and hence the gain of the amplification can be increased beyond that possible with a single element.

Referring to FIG. 10, there is shown an embodiment of this invention in which a high electric field domain in the element "A," which has an electric field effect type control electrode 9, can be detected independently of the current in the element "A" by a current change of the element "B" connected to the element "A" via insulators.

An advantage of this embodiment is that the detection of a high electric field domain in the element "A" can be made with high reliability without being affected by the field effect of the control electrode 9. The element "A" is biased in such a way as to generate a high electric field domain near the cathode when no signal voltage is applied to the control electrode. If a signal voltage of a negative polarity is applied to the control electrode 9, a depletion layer is produced and develops beneath the control electrode 9 to decrease the cross section of the semiconductor 1 at that place. Thus the electric field is increased at the place of the control electrode and consequently electric field near the cathode is decreased to inhibit the generation of a high electric field domain near the cathode of the element "A" and the device will function as an inhibitor device.

Figure 11:
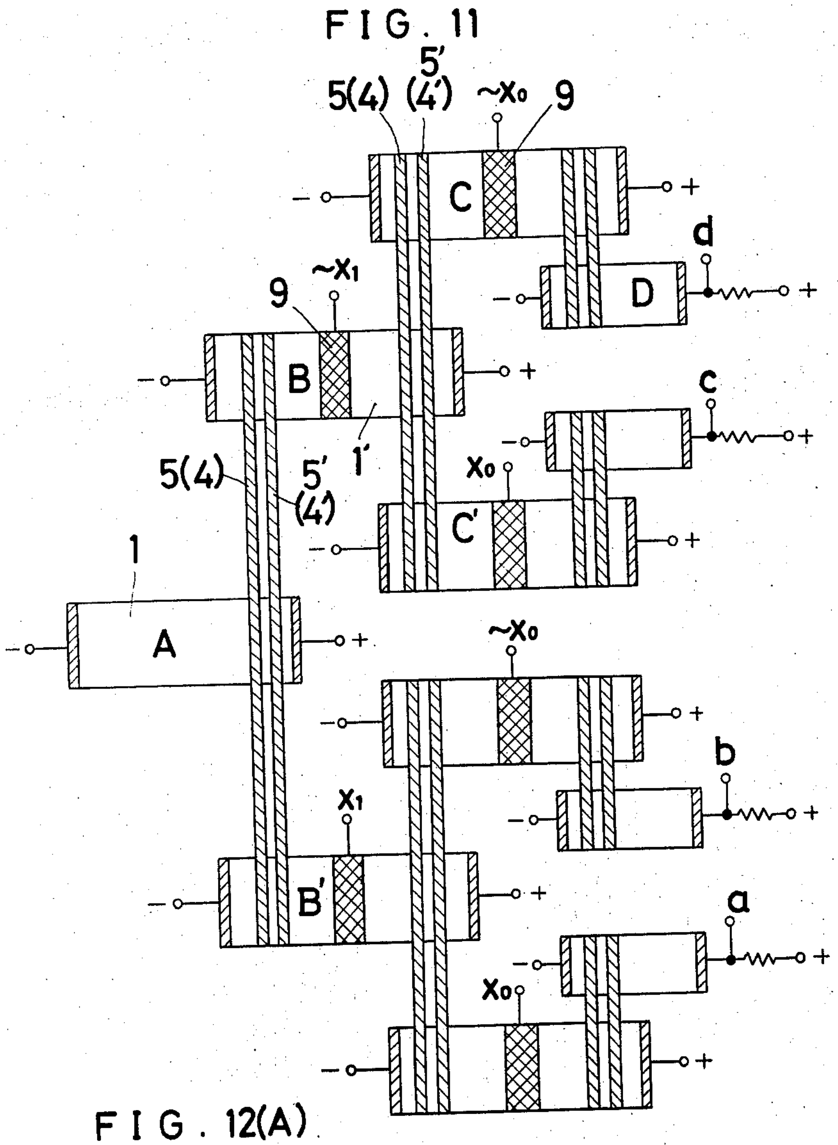
FIG. 11 shows a decorder device comprising a plurality of semiconductor elements connected in the form of a "tree."

Referring to FIG. 11, a plurality of such inhibitor element are connected in the form of a "tree," together constituting a decorder. In operation, a high electric field domain signal which is generated in response to the signal applied to the element "A," will be transferred either to the element "B" or to the element "B′" according to which the signals $x_1$, $\sim x_1$ applied to the control electrodes is of negative voltage. If, for example, the signal $x_1$ is of negative voltage the signal $\sim x$ will be of no voltage and therefore according to the principle mentioned in connection with FIG. 10 the high electric field domain that would otherwise be transferred to both of the element "B" and element "B′" will be inhibited from being transferred to the element "B′", and thus transferred only to the element "B." The high electric field domain thus transferred to the element "B" will then be transferred either to the element "C" or to the element "C′" according to which of the signals $x_0$, $\sim x_0$ applied to the control electrodes is of negative voltage. If, for example, the signal $x_0$ is of negative voltage, the high electric field will be transferred only to the element "C" to be detected by the element "D" at the output terminal *d.*

It will be clear from the above explanation that by suitably predetermining the polarities of signals $x_0$, $x_1$, a high electric field domain generated in the element "A" will be transferred and enventually will be detected at one predetermined output terminal among output terminals *a, b, c* and *d.*

The number of output terminals of a decorder is not necessarily confined to four as has been explained in connection with FIG. 11. It will be clear that by connecting the inhibitor elements explained in connection with FIG. 10 in larger number in the form of a "tree" than described in FIG. 11, a decorder which has output terminals more than four is obtained.

Referring to FIG. 12, the devices are shown as being composed of a pair of semiconductor elements "A" and "B" longitudinally staggered and integrally connected by an insulator 4. As shown in FIG. 12(A), a part of the element "A" is connected to a part of "B" at the cathode side thereof by the insulator 4. When a high electric field domain is generated at the cathode side of the connecting region in the element "A" (left side in the drawing), the potential will rise in the vicinity of the connecting region of the element "A." As a result the strength of the electric field increases between the cathode and the connecting region of the element "B," causing a high electric field domain to appear in this area.

Figure 12A:
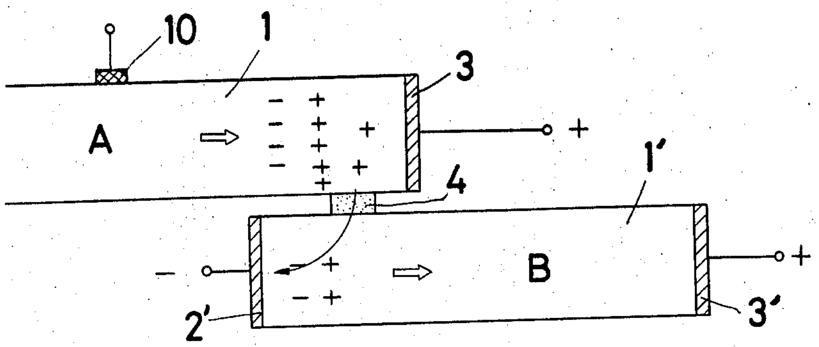
FIGS. 12(A) to 12(D) diagrammatically show several embodiments of the invention for transferring a high electric field domain from one semiconductor element to other employing the change in potential distribution in the element.
Figure 12B:
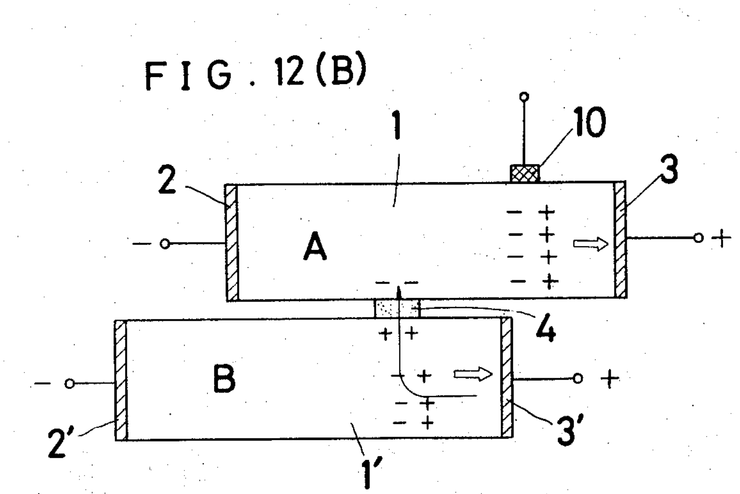

Referring to FIG. 12(B), where a part of the element "A" at the cathode side thereof is connected to a part of the element "B" at the anode side thereof by an insulator 4, and an electrode 10 for generating a high electric field domain is provided to the element "A" at the anode side of the connecting region (right side in the drawing), if a high electric field domain is generated in the element "A," the potential at the connecting region of the element will decrease. As a result, the strength of the electric field will increase between the connecting region and the anode 3' of the element "B," thus causing a high electric field domain to appear in this area. If the thickness of the semiconductor of the element is relatively thin or the area of the connecting insulator 4 is relatively large, the depletion layer produced under the connecting insulator in the element "B" will cause a high electric field domain to appear in the element "B."

Figure 12C:
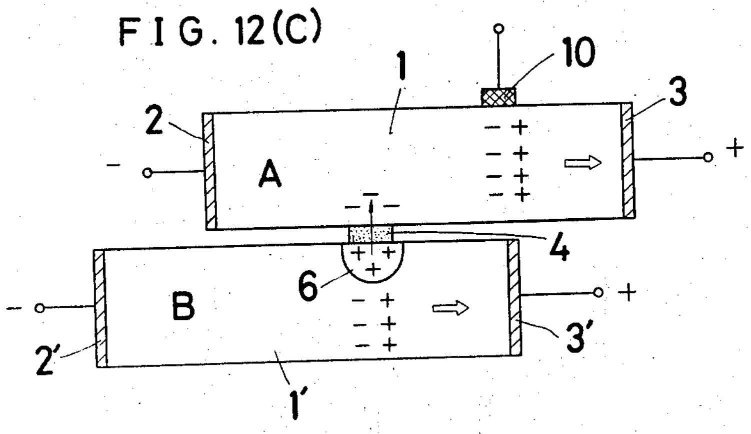

Referring to FIG. 12(C), the potential at the connecting region of the element "A" will decrease in response to the generation of a high electric field domain in the element "A." As a result, the electron depletion layer 6 will develop in the element "B," adjacent to the insulaor 4, thus causing the effective cross-section of this area to reduce, and finally causing a high electric field domain to appear.

Figure 12D:
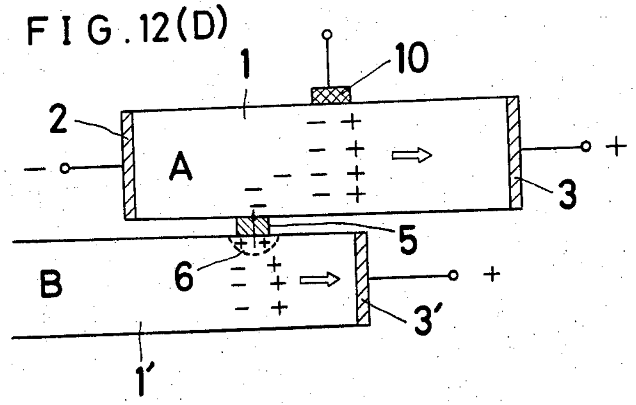

If a metal piece 5 is used in place of the insulator 4 as shown in FIG. 12(D), the potential at the connecting region of the element "A" will be lowered even further below the potential in the element "B" when a high electric field domain is generated at the anode side of the connecting region in the element "A" thus causing an electron depletion layer to appear below the metal piece in the element "B". This electron depletion layer 6 will function in a similar way to the insulator, thus causing a high electric field domain to appear in the element "B." In this instance, the width of the insulator or metal piece has no connection with the width of the high electric field domain, and the former may be narrower than the latter.

Figure 13:
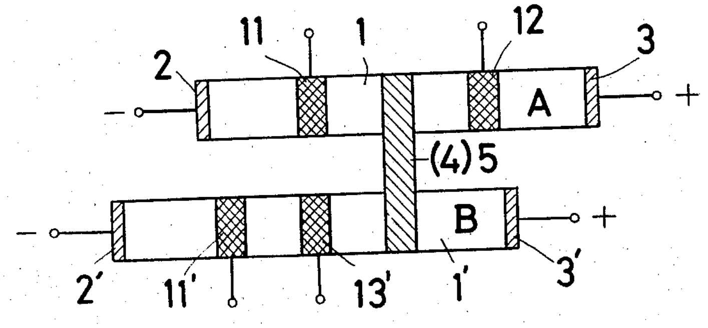
FIG. 13 shows another embodiment employing the change in potential distribution shown in which semiconductor elements are provided with control means for a high electric field domain.

Referring to FIG. 13, according to the principle above mentioned the planar device comprises semiconductor element "A" having a control electrode 11 at the cathode side and a generating electrode 12 at the anode side; a semiconductor element "B" having a control electrode 11' and a detecting electrode 13' at the cathode side; and a metal backed insulator 5 (or metal piece) to connect a part between the control electrode 11 and the generating electrode 12 of the element "A" to a part between the detecting electrode 13' and the anode 3' of the element "B." To each of these semiconductor elements is applied a voltage which is below the threshold voltage for generating a high electric field domain and above the minimum voltage required to sustain a high electric field domain. If a high electric field domain is generated in the element "A" in response to the signal applied to the generating electrode 12 of the element "A," the potential at the connecting region will decrease, thus finally causing a high electric field domain to appear in the element "B."

In this way the high electric field domain can be transferred from element "A" to element "B." The time required for the whole operation will be determined by the time required for the growth of the electron depletion layer and for the growth of the high electric field domain. This transferring time is as short as several tens pico seconds.

Figure 14:
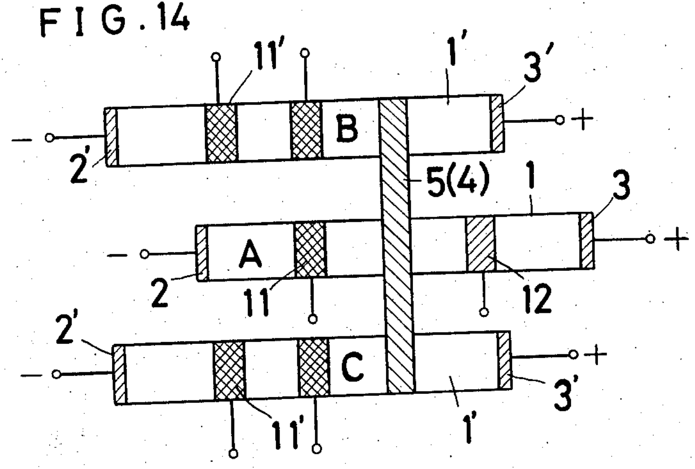
FIG. 14 shows a "Distributor" device in which a high electric field domain is transferred from one element to associated ones.

Referring to FIG. 14, there is shown a semiconductor device comprising three elements "A," "B" and "C." More specifically, the element "A" is connected to the elements "B" and "C." If a high electric field domain appears in the element "A," it will appear simultaneously in the other elements "B" and "C." Thus, the device functions as a "Distribution" device.

Figure 15:
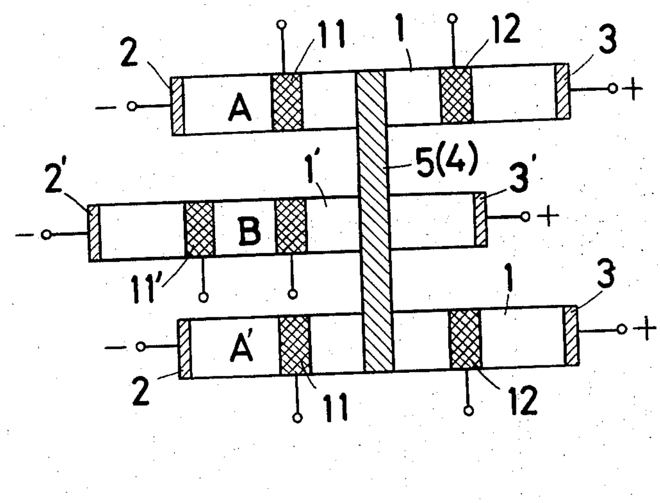
FIG. 15 shows another embodiment functioning as an "OR" device.

Referring to FIG. 15, there is shown a similar device, in which two elements "A" and "A'" are connected to the other element "B." If a high electric field domain appears in one of the elements "A" or "A'," it will be caused to appear in the element "B." Thus, the device of FIG. 15 can perform the "OR" operation. in FIGS. 14 and 15, each device is shown as being composed of three elements. As a matter of course, they may be composed of four or more elements, as for instance: three or more semiconductor elements in place of the elements "B" and "C" in FIG. 14 may be parallel-connected to constitute a "Distributor" device, in which a high electric field domain when appearing in the element "A" will be simultaneously transferred to each of the other elements. Likewise, three or more semiconductor elements in place of the elements "A" and "A'" of FIG. 15 may be parallelconnected to constitute or "OR" device, in which a high electric field domain when appearing in any one of these parallel-connected elements will be transferred to the element "B." If the control electrode 11 of the semiconductor element "A" of FIG. 13 is a capacitive one, such as a Schottky electrode, and if a negative voltage is applied to the control electrode, an electron depletion layer will be caused to appear and extend below the electrode, thus decreasing the cross-sectional area of the current passage. In other words, the application of a negative voltage to the control electrode 11 will cause the concentration of electric lines of force to the part of the semiconductor below the control electrode, thus reducing accordingly the strength of the electric field in the other part of the semiconductor. Therefore, even if an input signal is applied to the generating electrode 12, no high electric field domain will be generated in the element "A." On the other hand the potential at the connecting region of the element "B" will rise, and therefore the electron depletion layer below the insulator will diminish, thus causing no high electric field domain to appear in the element "B." The arrangement above mentioned will prevent a high electric field domain from erroneously appearing in the element "B." The above mentioned device will function as an inhibitor. It should be noted that a plurality of control or generating electrodes may be provided to the element "A" with a view to applying different signals to these electrodes.

Figures 16, 17:
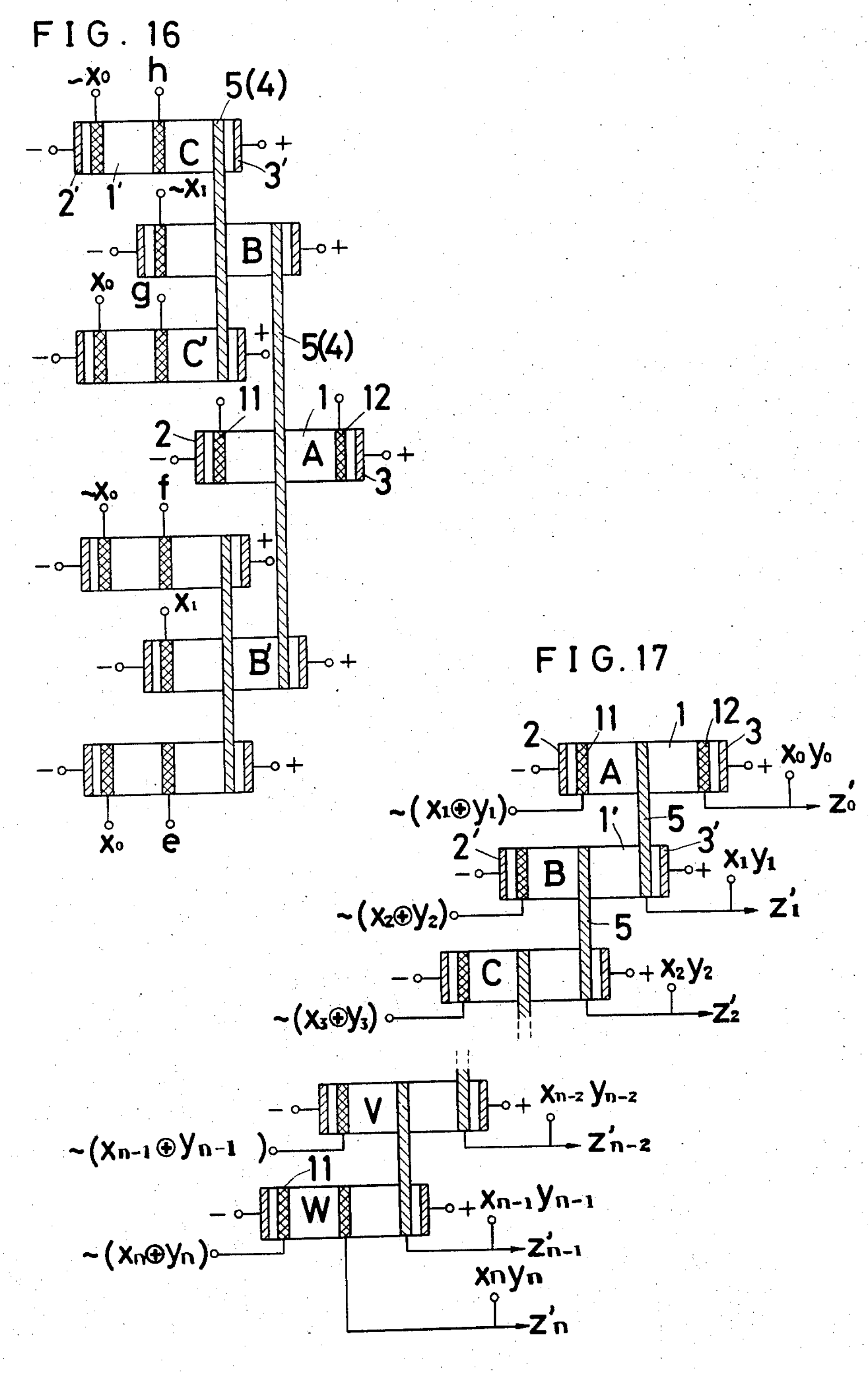
FIG. 16 shows a decorder device comprising a plurality of semiconductor elements connected in the form of a "tree."
FIG. 17 shows a digit carrying device according to this invention.

Referring to FIG. 16, a decorder device according to this invention is shown as comprising a plurality of semiconductor elements connected in the form of a "tree." In operation, a high electric field domain is caused to appear in response to the signal applied to the domain-generating electrode 12 of the semiconductor element "A," and the domain thus generated will be transferred either to the element "B" or to the element "B'" according to which of the signals $x_1$, $\sim x_1$ applied to the control electrodes is of negative voltage. If, for example, the signal $x_1$ is of negative voltage the signal $\sim x$ will be of no voltage and therefore according to the principle mentioned in connection with FIGS. 13 and 14 the high electric field domain that would otherwise be transferred to both of the element "B" and element "B'" will be inhibited from being transferred to the element "B'," and transferred only to the element "B." The high electric field domain thus transferred to the element "B" will then be transferred either to the element "C" or to the element "C'" according to which of the signals $x_0$, $\sim x_0$ applied to the control electrodes is of negative voltage. If, for example, the signal $x_0$ is of negative voltage, the high electric field will be transferred only to the element "C" to be detected by the element "D" at the detecting terminal *d*.

It will be clear from the above explanation that by suitably predetermining the polarities of signals $x_0$, $x_1$, a high electric field domain generated in the element "A" will be transferred and eventually will be detected at one predetermined detecting terminal among detecting terminals *e*, *f*, *g* and *h*.

The number of detecting terminals at the final stage of a decorder is not necessarily confined to four as has been explained in connection with FIG. 16. It will be clear that by connecting the inhibitor elements explained in connection with FIG. 13 in larger number in the form of a "tree" than has been discribed in FIG. 16, a decorder which has detecting terminals at the final stage more than four is obtained. As readily understood from the above, the length of each semiconductor element can be made short enough to permit the application of a relatively low bias voltage to the element, and the speed of operation is enhanced.

As is well known, in the conventional adder of the electronic computer the arithmetic operation begins with the least significant digit, feeding a "carry" signal to a subsequent higher digit. In performing the arithmetic operation of 40 digits in the binary system, for example, it takes forty times as long as the time involved for performing a single digit calculation.

Referring to FIG. 17, there is shown a high-speed digit carrying device according to this invention in which the middle part of the first semiconductor element "A" provided with generating means 12 for a high electric field domain at the anode side thereof is connected to the anode side of a second semiconductor element "B" and the middle part of said second semiconductor element "B" is connected to the anode side of a third semiconductor element "C," and so on, the final semiconductor element "W" is provided with detecting means, each element being provided with control means 11 for a high electric field domain at the cathode side thereof.

$$2^n x_n + 2^{n-1} x_{n-1} + \ldots 2x_1 + x_0$$

$$2^n y_n + 2^{n-1} y_{n-1} + \ldots 2y_1 + y_0$$

In performing a binary addition operation of the above two binary numbers, one starts with adding at least significant digit, i.e. $x_0$ and $y_0$. If both $x_0$ and $y_0$ are 1, there is a carry $z'_0$ which is carried to the second least significant digit, i.e. $x_1$ and $y_1$. The operation is now performed at this digit where one has to find a sum and a carry taking into account $x_1$, $y_1$ and $z'_0$.

The same sort of operation is repeated until a carry $z'_{n-1}$ is carried over to the most significant digit, i.e. $x_n$ and $y_n$ and the sum and carry is found at that digit. In the conventional circuit with conventional electronic components, the whole operation has been performed time-sequentially, i.e., each digit starts doing calculation on receiving a carry from the next lower digit, thus the time required to perform the whole operation has been nearly equal to the number of digit times the time required to perform the operation at each digit.

In the device according to this invention, carry-finding operation is performed in advance and carry at each stage is performed beforehand.

The carry $z'_1$ that will be generated, for example, at the second least significant digit in relation to $x_1$, $y_1$ and $z'_0$ is tabulated in a truth table below.

Table

| $x_1$ | $Y_1$ | $z'_0$ | $z'_1$ |
|---|---|---|---|
| 1 | 1 | 0 | 1 |
| 1 | 0 | 1 | 1 |
| 0 | 1 | 1 | 1 |
| 0 | 0 | 1 | 0 |
| 0 | 0 | 0 | 0 |

It will be clear on inspection of the Table that the carry $z'_1$ is generated only when the logical sum $x_0 \cdot y_0$ is 1 and at the same time the negation of exclusive "OR," $\sim(x_1 + y_1)$ is 0.

Let us correspond 1 and 0 in the truth Table to a negative voltage and no voltage, respectively.

In FIG. 17, as understood from the principle of this invention, a high electric field domain is generated in the element "A" only when the signal $x_0 \cdot y_0$ is 1 (negative voltage) and at the same time the signal $\sim(x_1 + y_1)$ is 0 (no voltage), and this generated high electric field domain produces a negative output voltage, the carry $z'_0$ of 1.

The high electric field domain in the element "A" is also liable to be transferred to the element "B," and this transfer is permitted only when the signal $\sim(x_2 + y_2)$ is 0.

Therefor, a high electric field domain is generated in the element "B" to produce the carry $z'_2$ when either $x_1 \cdot y_1$ or $z'_1$ is 1 and $\sim(x_2 + y_2)$ is 0. In this way, the carry-finding operation is performed at each digit at very high speed.

In FIG. 17, "$z'_0$, $z'_1$ . . . $z'_n$" indicate carry signals which will be carried to the relevant next digit from the $2^0$, $2^1$ . . . $2^n$ digit respectively. Each parallel digit element can perform simultaneously the associated arithmetic operation in such a systematic way that the whole arithmetic operation is carried out at once, thus reducing the time involved for calculation to the minimum.

The device of this invention has such numerous advantages over the conventional devices, as compactness in size, simpleness in structure, consequent high reliability, high speed in operation, and superior performance. In the device of this invention, a high electric field domain can be made to travel a long distance over a number of semiconductor elements, each being relatively short to be operated at a relatively low bias voltage, thus complex logic operation by using a high electric field domain or high degree of amplification of space charges can easily been performed.

Further, according to the present invention, a high electric field domain or space charges generated in one semiconductor element is directly transferred to other semiconductor element through the medium of insulator, thus reducing the operation time of the deivce to a minimum.

Furthermore, according to this invention, informations represented by a high electric field domain can be distributed or collected under control to provide unique information processing devices of extremely high quality, such as Amplifier, Distributor, Decorder, "OR" device, Inhibitor, Carry performing device and so on.

As described above, this invention is highly adaptable to a various applications in the field of ultra-high speed information processing engineering as well as in the field of microwave electronics with enormous advantages.

What is claimed is:

1. A bulk semiconductor device comprising: at least two semiconductor elements, each semiconductor element being made of a semiconductor material which shows differential negative conductivity when subjected to a relatively high electric field and having an anode electrode and a cathode electrode at opposite ends thereof, and means for coupling a high field domain in one of said semiconductor elements to another of said semiconductor elements, said means being capacitively coupled to each of said elements over a length at least equal to the width of a high field domain in said semiconductor elements, said means simultaneously deriving a pair of oppositely poled signals from a first semiconductor element upon passage of a high field domain therethrough and applying said pair of oppositely poled signals to a second semiconductor element to induce a high field domain in said second semiconductor element, said pair of signals being derived from oppositely charged regions bordering the high field domain in said first semiconductor element.

2. The bulk semiconductor device according to claim 1 wherein said means for coupling is a single piece.

3. The bulk semiconductor device according to claim 1 wherein said means for coupling is a pair of pieces.

4. The bulk semiconductor device according to claim 2 wherein said piece has a metal applied thereon.

5. The bulk semiconductor device according to claim 2 wherein said piece is a Schottky-type contact.

6. The bulk semiconductor device according to claim 3 wherein said pair of pieces have metal applied thereon.

7. The bulk semiconductor device according to claim 3 wherein said pair of pieces are Schottky-type contacts.

8. The bulk semiconductor device according to claim 1 wherein a part of at least one first semiconductor element in the vicinity of the anode electrode thereof is connected to a part of at least one second semiconductor element in the vicinity of the cathode electrode thereof.

9. The bulk semiconductor device according to claim 8 wherein one first semiconductor element is disposed relative to at least two second semiconductor elements whereby a high electric field domain in the first semiconductor element is transferred to each of the second semiconductor elements.

10. The bulk semiconductor device according to claim 8 wherein at least two first semiconductor elements are disposed relative one second semiconductor element whereby high electric field domain in any of the first semiconductor elements is transferred to the second semiconductor element.

11. The bulk semiconductor device according to claim 8 wherein at least one first semiconductor element and at least one second semiconductor element are connected in a closed loop whereby high electric field domain generated in any of said semiconductor elements repeatedly travels around the semiconductor elements forming said closed loop.

12. The bulk semiconductor device according to claim 1 wherein a part of at least one first semiconductor element at the anode side thereof is connected to a part of at least one second semiconductor element at the cathode side thereof whereby high electric field domain in the first element is transferred to the second element.

13. The bulk semiconductor device according to claim 1 wherein a part of at least one first semiconductor element at the cathode side thereof is connected to a part of at least one second semiconductor element at the anode side thereof whereby high electric field domain in the first element is transferred to the second element.

14. The bulk semiconductor device according to claim 1 wherein at least one of said first or second semiconductor elements is provided with control means for high electric field domain and at least one other of said semiconductor elements is provided with detecting means for high electric field domain.

15. The bulk semiconductor device according to claim 8 wherein the first semiconductor element is provided with generating means for high electric field domain and the second semiconductor element is provided with detecting means for high electric field domain whereby a signal applied to the generating means is first amplified and thereafter detected.

16. The bulk semiconductor device according to claim 15 wherein said generating means and detecting means are capacitive electrodes.

17. The bulk semiconductor device according to claim 8 wherein a part of the first semiconductor element in the vicinity of the anode electrode is provided with generating means for high electric field domain and is connected to a part in the vicinity of the cathode electrode of a second semiconductor element, a part in the vicinity of the anode electrode of the second semiconductor element being connected to a part in the vicinity of the cathode electrode of a third semiconductor element, the connection between any number of subsequent semiconductor elements being in this manner, the final semiconductor element of such connection being provided with detecting means for high electric field domain whereby a signal applied to said generating means is amplified and thereafter detected.

18. The bulk semiconductor device according to claim 14 wherein a part of the first semiconductor element at the anode side thereof is connected to a part of two second semiconductor elements, said second semiconductor elements being provided with control means for high electric field domain at the respective cathode side thereof, a part of each of said second semiconductor elements at the anode side thereof being connected to a part of two third semiconductor elements provided with control means for high electric field domain at the cathode side thereof, and a part of each of said third elements at the anode side thereof being connected to a part of two fourth semiconductor elements provided with detecting means for high electric field domain whereby high electric field domain is transferred to and detected from any selected fourth semiconductor element by a set of signals for each of said control means.

19. The bulk semiconductor device according to claim 14 wherein at least one first semiconductor element is provided with generating means for high electric field domain and at least one second semiconductor element is provided with control means and detecting means for high electric field domain.

20. The bulk semiconductor device according to claim 19 wherein one first semiconductor element is disposed relative two second semiconductor elements.

21. The bulk semiconductor device according to claim 19 wherein at least two first semiconductor elements are disposed relative one second semiconductor element.

22. The bulk semiconductor device according to claim 14 wherein at least one first semiconductor element is provided with control means for high electric field domain and at least one second semiconductor element is provided with control means and detecting means for high electric field domain.

23. The bulk semiconductor device according to claim 22 wherein one first semiconductor element is disposed relative at least two second semiconductor elements.

24. The bulk semiconductor device according to claim 22 wherein at least two first semiconductor elements are disposed relative one second semiconductor element.

25. The bulk semiconductor device according to claim 14 wherein a middle part of the first semiconductor element provided with generating means for high electric field domain at the anode side thereof is connected to an anode side of a second semiconductor element, and a middle part of the second semiconductor element is connected to an anode side of a third semiconductor element, the connection between any number of subsequent semiconductor elements being in this manner, the final semiconductor element of such connection being provided with detecting means for high electric field domain, each semiconductor element being provided with control means for high electric field domain at the cathode side thereof.

26. A method for transferring a high electric field domain from one semiconductor element to a second semiconductor element, each semiconductor element being made of a semiconductor material which shows differential negative conductivity when subjected to a relatively high electric field and having an anode and a cathode at opposite ends thereof, said semiconductor elements being capacitively coupled to each other over a length at least equal to the width of the high field domain to be transferred, which method comprises, simultaneously deriving a pair of oppositely poled signals from the first semiconductor element upon passage of a high field domain therethrough, applying the pair of oppositely poled signals from the first semiconductor element to the second semiconductor element and inducing the high field domain in said second semiconductor element by means of the capacitive coupling, said pair of signals being derived from oppositely charged regions bordering the high field domain in said first semiconductor element.

27. The method for transferring a high electric field domain according to claim 26 wherein the high field domain is transferred in a single piece capacitive coupling.

28. The method for transferring a high electric field domain according to claim 25 wherein the high field domain is transferred in a pair of capacitive coupling pieces.

* * * * *